United States Patent
Chang et al.

(10) Patent No.: US 10,229,232 B2
(45) Date of Patent: Mar. 12, 2019

(54) PREDICTIVE TACHOMETER PROFILE GENERATION DURING TRANSMISSION SHIFT EVENTS

(71) Applicant: GM GLOBAL TECHNOLOGY OPERATIONS LLC, Detroit, MI (US)

(72) Inventors: Richard I. Chang, Ann Arbor, MI (US); Matthew D. Whitton, Howell, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 254 days.

(21) Appl. No.: 15/220,912

(22) Filed: Jul. 27, 2016

(65) Prior Publication Data
US 2018/0032650 A1   Feb. 1, 2018

(51) Int. Cl.
| | | |
|---|---|---|
| *B60K 37/00* | (2006.01) | |
| *F16H 63/42* | (2006.01) | |
| *F16H 61/22* | (2006.01) | |
| *G06F 17/50* | (2006.01) | |
| *F16H 63/40* | (2006.01) | |
| *F02D 41/02* | (2006.01) | |
| *G06Q 10/04* | (2012.01) | |
| *F02D 41/14* | (2006.01) | |

(52) U.S. Cl.
CPC ....... *G06F 17/5009* (2013.01); *F02D 41/023* (2013.01); *F02D 41/0225* (2013.01); *F16H 63/40* (2013.01); *F02D 2041/1412* (2013.01); *F02D 2041/1431* (2013.01); *F02D 2200/0602* (2013.01); *F02D 2200/1004* (2013.01); *F02D 2200/501* (2013.01); *G06Q 10/04* (2013.01)

(58) Field of Classification Search
CPC ............................. G06F 17/5009; F16H 63/40
USPC ............................................................. 703/8
See application file for complete search history.

(56) References Cited

U.S. PATENT DOCUMENTS

| | | | |
|---|---|---|---|
| 5,835,875 A * | 11/1998 | Kirchhoffer | .......... F16H 61/061 |
| | | | 701/51 |
| 6,625,562 B2 | 9/2003 | Hayashi et al. | |
| 7,841,962 B2 | 11/2010 | Boutell | |
| 9,347,557 B2 * | 5/2016 | Doering | ................. F16H 63/42 |
| 9,696,333 B2 | 7/2017 | Teratani et al. | |

(Continued)

OTHER PUBLICATIONS

Chang, Richard I. et al., U.S. Appl. No. 15/234,723, entitled "Predictive Tachometer Profile Generation During Idle Revving Events," filed Aug. 11, 2016.

(Continued)

*Primary Examiner* — Aniss Chad
*Assistant Examiner* — Faraj Ayoub
(74) *Attorney, Agent, or Firm* — Lorenz & Kopf, LLP (57) ABSTRACT

Methods and systems are provided for generating a predictive tachometer profile at a tachometer of a vehicle. When an inertia phase of a transmission shift event is determined to be in progress, the predictive tachometer profile can be computed based on: a computed shift completion percentage; a difference between the current attained gear speed and the commanded gear speed; and a commanded engine torque that is determined based on the accelerator pedal position and the vehicle speed. The predictive tachometer profile can then be displayed at the tachometer. The predictive tachometer profile accounts for delays in a signal path between an engine speed sensor and the tachometer.

15 Claims, 5 Drawing Sheets

(56) References Cited

U.S. PATENT DOCUMENTS

| | | |
|---|---|---|
| 9,897,625 B2 | 2/2018 | Teratani et al. |
| 2005/0280521 A1 | 12/2005 | Mizumaki |
| 2014/0229076 A1 | 8/2014 | Doering et al. |
| 2015/0151738 A1* | 6/2015 | Dlugoss ............... B60W 20/40 701/22 |
| 2015/0175004 A1 | 6/2015 | Yasunaga et al. |
| 2016/0010746 A1* | 1/2016 | Turner ............... F16H 61/0213 701/51 |
| 2016/0138468 A1* | 5/2016 | Shibata ................... G01D 7/00 701/110 |
| 2017/0120750 A1 | 5/2017 | Romani et al. |
| 2018/0032650 A1 | 2/2018 | Chang et al. |

OTHER PUBLICATIONS

USPTO, Non-final Office Action issued in U.S. Appl. No. 15/234,723, dated Mar. 19, 2018.
State Intellectual Property Office of the People's Republic of China, Office Action for Chinese Patent Application No. 201710546978.1 dated Nov. 1, 2018.

* cited by examiner

FIG. 4

PREDICTIVE TACHOMETER PROFILE GENERATION DURING TRANSMISSION SHIFT EVENTS

TECHNICAL FIELD

The present invention generally relates to tachometers used in vehicles, and more particularly relates to a predictive tachometer that, during transmission shift events, generates a predictive tachometer profile that can be displayed at an instrumentation panel.

BACKGROUND

A tachometer is a gauge that is part of a vehicle's instrumentation panel that displays a value of engine speed usually in revolutions per minute (RPM). In some implementations, a source of engine speed (e.g., crankshaft or camshaft position sensor) can be directly wired to the instrumentation panel that houses the tachometer. In other implementations, engine speed can be computed via an engine control module (ECM) based on information derived from either the crankshaft or camshaft speed sensor and an engine speed signal can be indirectly sent to the tachometer via serial data communication (e.g., via a controller area network (CAN) bus). Traditionally engine speed was displayed on a calibrated analogue dial that includes a needle fixed about a point that is directed to one of a plurality of numerical indications, i.e., 1000 RPM, 2000 RPM, 4000 RPM, and others. More recently, digital tachometers have become the state of the art for presenting engine speed.

Tachometers can allow the driver to visually assess operating speed of the engine, and assist the driver in selecting appropriate throttle and gear settings for the driving conditions. A driver of the automobile reads the tachometer to determine whether or not to shift gears or adjust the speed of the automobile. The driver should shift gears at selected engine speeds to extract maximum power from the engine and achieve maximum vehicle speed. Shifting to a higher transmission gear (or upshifting) too early often results in a loss of power and causes reduced acceleration or even stalling. Upshifting too late may result in over-revving the engine, that is, reaching an engine speed greater than a maximum recommended speed, which can cause damage to the engine or other portions of the drive train. Shifting to a lower transmission gear (or downshifting) at the wrong time often causes over-revving of the engine, which is commonly called "Redlining" the engine. Redlining may damage the engine. Unfortunately, it is often difficult to be able to shift at an appropriate time.

When the engine of the vehicle responds to the driver of the vehicle depressing the accelerator (e.g., while driving or when the vehicle is in park or neutral), this causes a corresponding response at the tachometer that can be viewed by the driver. In addition, events such as shifting gears can also cause a response at the tachometer to change. In most cases, the driver can also hear the response of the engine as the accelerator is depressed or when gears are shifted. In an ideal operating scenario, the response of the tachometer would match or be synchronized with the response of the vehicle to the acceleration or gear shift. For example, the tachometer needle should begin moving as soon as engine speed is transitioning since a synchronized engine sound and tachometer can greatly improve perception of powertrain performance.

However, in a real vehicle, there are many sources of delay in the signal path between the sensors that measure engine speed (or source of engine speed) and the tachometer (of the instrument panel) that displays an indication of rpm. These sources of delay cause the response that is presented on the tachometer to be out of synchronization with (or lag) the response of the vehicle to the acceleration or gear shift. For instance, some sources of the delayed response at the tachometer can include: delay in the engine's response to the driver interacting with the accelerator (or gear shifter); delay associated with an engine speed determination in an engine control module (ECM); delays associated with vehicle communication systems such as a high-speed controller area network (CAN) bus and a low-speed CAN bus; delays associated with a body control module (BCM); delay associated with internal signal processing by the instrument panel (IP); delay associated with dead-band filtering in the IP (calibration); delay associated with displaying the RPM indication at the tachometer, etc. As such, there are many sources that can contribute to a delayed response of the tachometer. A delayed tachometer response can contribute to negative perception by the user that the engine and/or transmission may be sluggish.

There is a need for tachometers that can provide improved performance and that can improve the user's perception of powertrain performance by mitigating communication delays between source of engine speed and the tachometer. There is a need for tachometer s that exhibit improved responsiveness despite many sources of delay that exist in a signal path between the tachometer and the sensors that measure engine speed. It would be desirable to provide a tachometer that generates an engine speed signal with reduced response delay so that the tachometer output at an instrumentation panel more closely matches that actual engine speed. Furthermore, other desirable features and characteristics of the present invention will become apparent from the subsequent detailed description of the invention and the appended claims, taken in conjunction with the accompanying drawings and this background of the invention.

BRIEF SUMMARY

Methods and systems are provided for generating a predictive tachometer profile at a tachometer of a vehicle. When an inertia phase of a transmission shift event is determined to be in progress, the predictive tachometer profile can be computed based on: a computed shift completion percentage; a difference between the current attained gear speed and the commanded gear speed; and a commanded engine torque that is determined based on the accelerator pedal position and the vehicle speed. The predictive tachometer profile can then be displayed at the tachometer.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

In accordance with the disclosed embodiments, a vehicle is provided that includes an improved tachometer. As used herein, the term "predictive tachometer" can refer to a controller (e.g., predictive tachometer module) that generates a predictive tachometer profile. The predictive tachometer profile is an artificial engine speed signal that is shifted to account for delays between an engine speed sensor (e.g., crankshaft position sensor or camshaft position sensor) and a tachometer where engine speed is displayed to the driver. The predictive tachometer profile is computationally adjusted version of engine speed that accounts for delays in generating and communicating that engine speed information to the tachometer. The engine speed that is displayed provides a more accurate representation of engine speed.

In one embodiment, a predictive tachometer profile is generated that is displayed at a tachometer of a vehicle. When an inertia phase of a transmission shift event is determined to be in progress, the predictive tachometer profile can be computed based on: a computed shift completion percentage; a difference between the current attained gear speed and the commanded gear speed; and a commanded engine torque that is determined based on the accelerator pedal position and the vehicle speed. By providing the predictive tachometer profile to the tachometer during transmission shift events, the dynamic response at the tachometer can account for communication delays between the source of engine speed and the instrumentation panel where the tachometer is located. The predictive tachometer profile targets the commanded gear speed during the transmission shift event. The profile shape of the predictive tachometer profile is controllable based on the difference between current attained gear speed and commanded gear speed, and the driver commanded engine torque that is a function of current vehicle speed and accelerator pedal position. This can improve the user/driver experience since the engine speed displayed at the tachometer more closely matches the commanded engine torque, which improves the user/driver's perception of powertrain performance.

Figure 1:
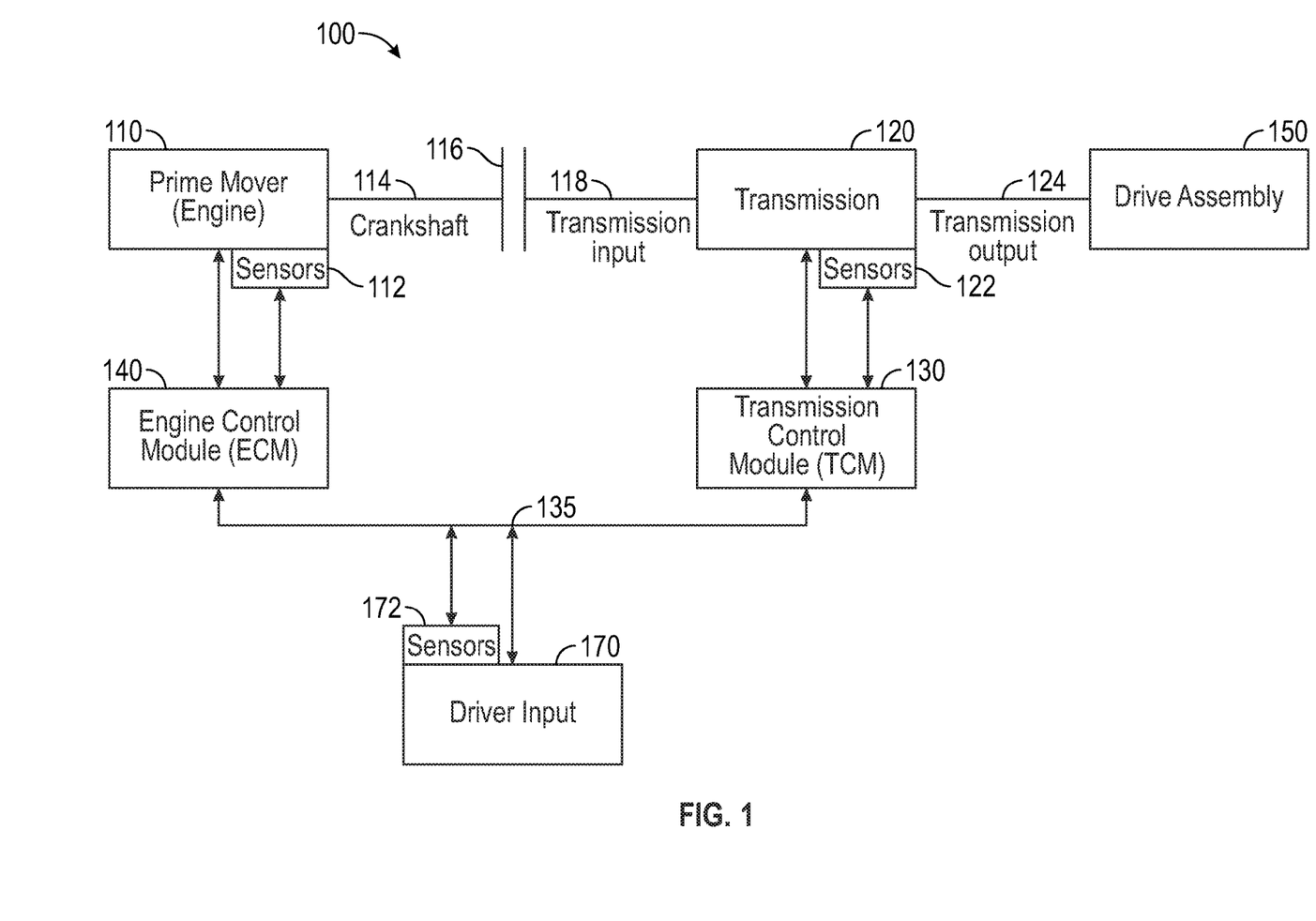
FIG. 1 is functional block diagram of a powertrain system of a motor vehicle in accordance with an embodiment of the present disclosure.

FIG. 1 is functional block diagram of a powertrain system 100 of a motor vehicle in accordance with an embodiment of the present disclosure. The components of the powertrain system 100 include a prime mover 110, a transmission 120, a transmission control module (TCM) 130, an engine control module (ECM) 140, a driveshaft 150, a driver interface 160, a driver input 170, and various blocks of sensors 112, 122, 162, 172.

As used herein, a "module" can refer to a controller or software executed at a controller that controls vehicle systems, sub-systems, actuators, sensors, switches and the like. Each module in a vehicle can perform a certain functions for a controlling a certain vehicle system or sub-system, such as an engine, transmission, chassis, etc. Non-limiting examples of vehicle modules can include, for example, an Engine Control Unit (ECU) or Engine Control Module (ECM), a Transmission Control Module (TCM), a chassis control module (CCM), a Body Control Module (BCM), etc.

The prime mover 110 may be an internal combustion engine (ICE) such as a gasoline, Diesel or flex fuel engine, or a hybrid or electric power plant. The prime mover 110 includes a crankshaft 114 which drives a turbine or input clutch 116. A turbine is used for a planetary transmission, while an input clutch is used for a dual clutch transmission or automated manual transmission. The turbine/clutch 116 selectively provides drive torque to an input shaft 118 of a transmission 120.

The transmission 120 may include a housing as well as shafts, gears and synchronizer clutches (all not illustrated) which cooperatively provide, for example, multiple forward and reverse gears. In addition to the input shaft 118, the transmission 120 includes an output shaft 124 which is coupled to a final drive assembly 150 that may include, for example, a driveshaft, a differential assembly, drive axles, and wheels that are driven.

The transmission control module (TCM) 130 is a controller, microprocessor or other electronic device that performs a variety of transmission monitoring and control tasks to assist in the control of the transmission to help it operate more efficiently and more reliably. The TCM regulates the transmission by processing electrical signals received from various sensors 122, 172 to help the vehicle's transmission work efficiently and dependably.

The engine control module (ECM) 140 is a controller, microprocessor or other electronic device that performs a variety of engine monitoring and control tasks. The ECM 140 reads data from various sensors engine sensors, and processes that data to control a series of actuators associated with the engine to ensure optimal performance. The TCM and ECM 130, 140 can share information with each other over a network 135, such as a Controller Area Network (CAN) bus 135. The ECM 140 and/or the TCM 130 control powertrain output torque.

A driver input 160 communicates with the TCM 130 and ECM 140 via a bus 135. The driver input 160 generally includes those controls and devices under the control of and operated by the vehicle operator (not illustrated). The driver input 160 can include, but is not limited to, an accelerator pedal, a brake pedal, a transmission range selector (e.g., a PRNDL lever), etc.

The prime mover 110, transmission 120, the driver interface 160, and the driver input 170 can each have various sensors associated with each. Each block of sensors 112, 122, 162 in FIG. 1 can include one or more sensors. Sensors 112, 162 can provide real time data to the ECM 140, whereas sensors 122, 162 can provide real time data to the TCM 130.

Sensors 112 can include, for example, engine speed sensors such as a crank position sensor that can detect position and/or speed of a crankshaft and/or a cam position sensor that can detect position and/or speed of a camshaft, and provide that information to the ECM 140. For example, the crank position sensor can be used to detect position of crankshaft 114, and the cam position sensor can be used to detect position of camshaft (not illustrated). In either case, the raw position signal (in terms of frequency (Hz)) can be sent to ECM 140 and conditioned/converted to speed (in terms of rpm). In this regard, the engine speed signals may be considered raw engine speed signals until signal conditioned by the ECM 140 or other signal conditioning circuitry. The sensors 112 can also include a wheel speed sensor 221 that can detect true vehicle speed and provide it to the ECM via a chassis control module.

Sensors 122 can include, for example, a transmission input speed sensor (TISS) that senses the instantaneous speed of the input shaft 118 of the transmission 120, a transmission output speed sensor (TOSS) senses the instantaneous speed of the output shaft 124 of the transmission 120, a transmission range selector sensor that is configured to generate an output signal which indicates which gear range (e.g. forward, neutral, and reverse)) is selected, a tap switch sensor that provides information regarding tap mode status that shows whether driver is in control of transmission commanded gear. The sensors 122 can then provide that information to the TCM 130.

Sensors 162 can include, for example, an accelerator position sensor that senses the instantaneous position of an accelerator pedal (not illustrated), a brake pedal position sensor that senses the position of a brake pedal (also not illustrated), etc. The sensors 162 can then provide that information to the ECM 140. The ECM 140 can compute the driver's commanded torque based on the vehicle speed and the position of accelerator pedal. In one embodiment, the ECM 140 stores a two-dimensional lookup table (LUT) that uses the vehicle speed and the position of the accelerator pedal to generate the driver's commanded torque.

Figure 2A:
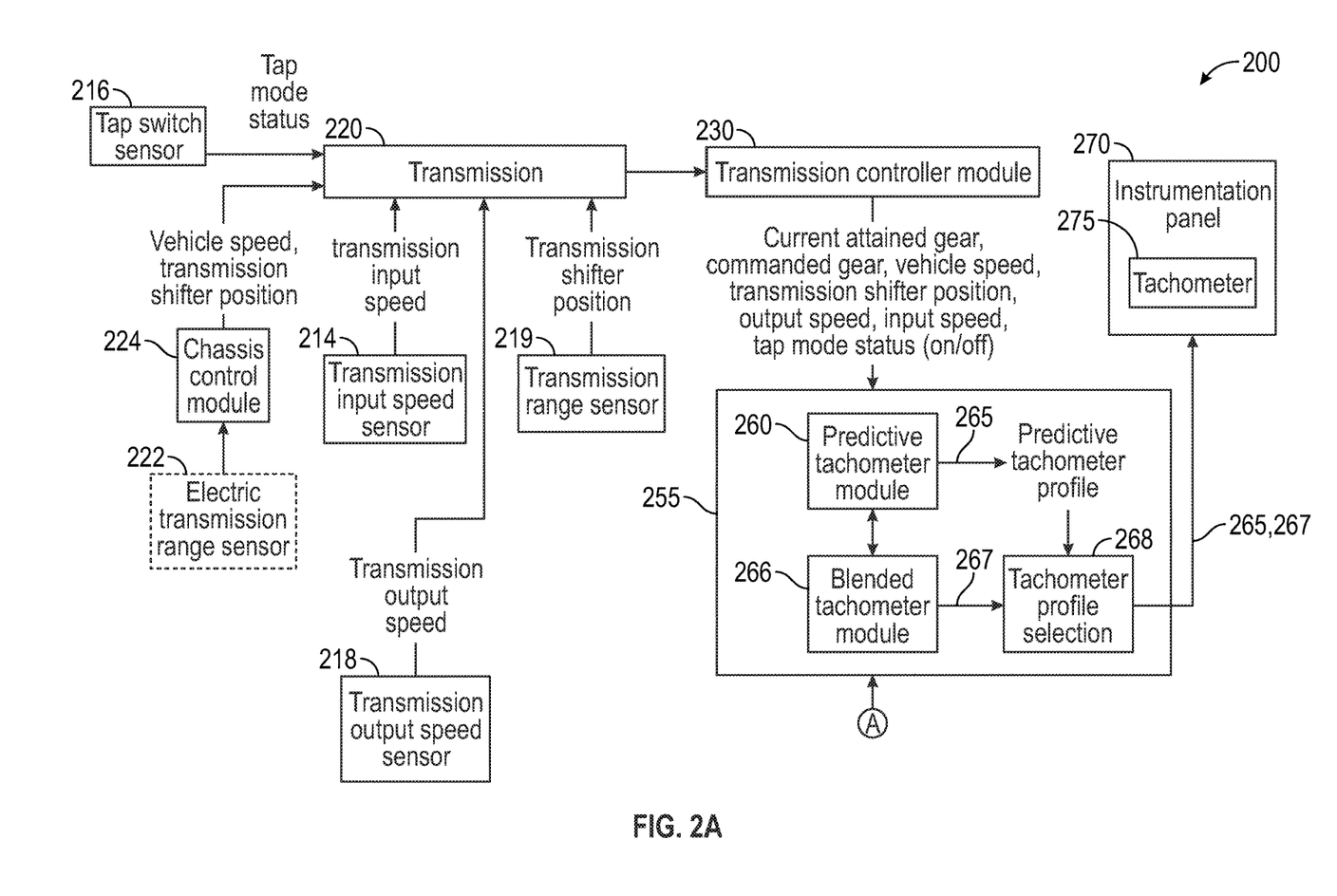
FIGS. 2A and 2B are a functional block diagram that collectively illustrates a system of a motor vehicle that is used to generate a predictive tachometer profile in accordance with an embodiment of the present disclosure.
Figure 2B:
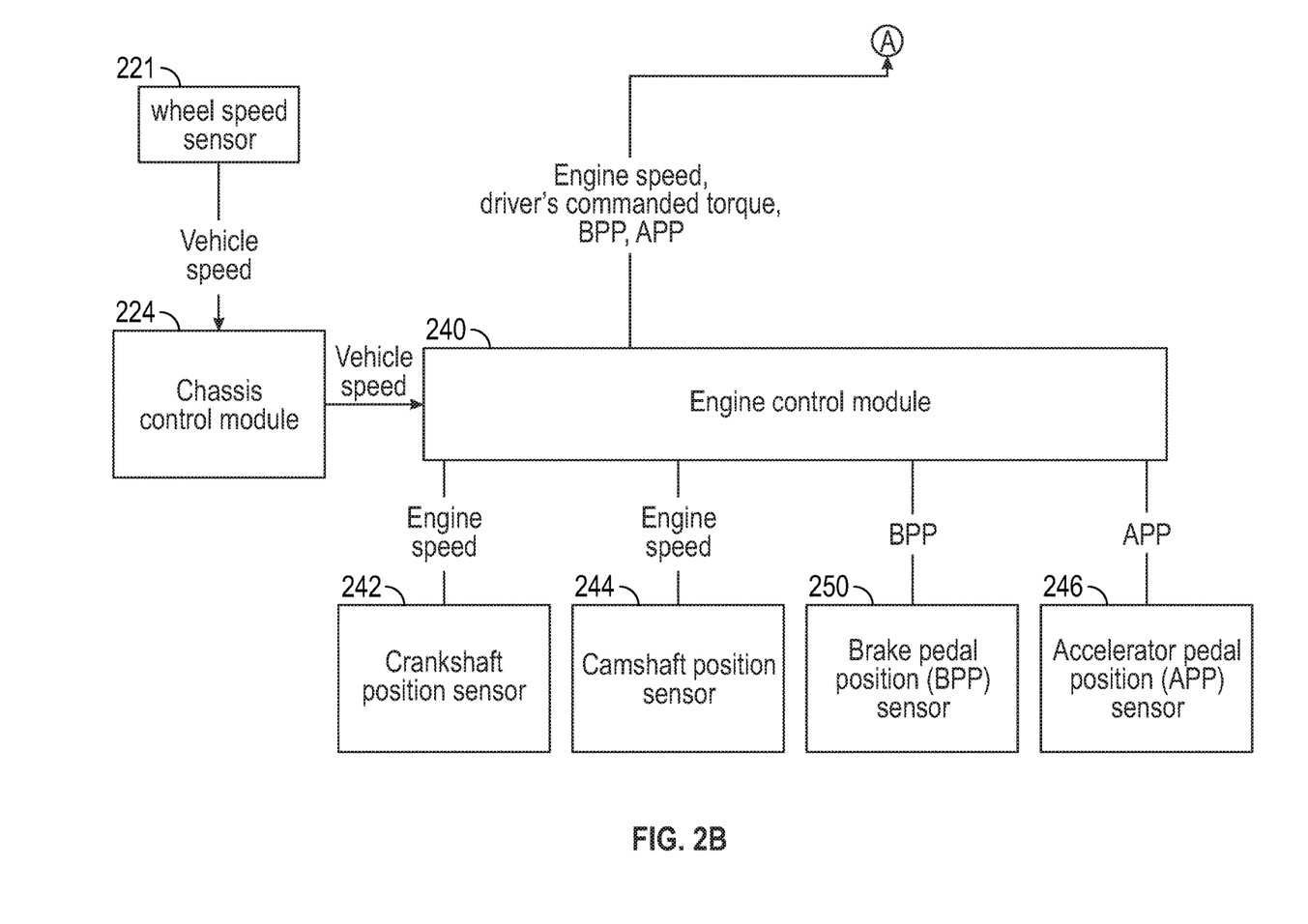

FIGS. 2A and 2B are a functional block diagram that collectively illustrates a system 200 of a motor vehicle that is used to generate a predictive tachometer profile 265 in accordance with an embodiment of the present disclosure.

The vehicle system 200 includes a transmission 220, a TCM 230 for the transmission 220, an ECM 240 for an engine (not illustrated), and a tachometer profile module 255 that includes a predictive tachometer module 260, a blended tachometer module 266, and a tachometer profile selection module 268. The predictive tachometer module 260 can generate the predictive tachometer profile 265, whereas the blended tachometer module 266 can generate a blended tachometer profile 267. The tachometer profile selection module 268 can select either the predictive tachometer profile 265 or the blended tachometer profile 267, and output the selected profile to a tachometer 275. The tachometer 275 can be part of the vehicle's instrumentation panel 270, and is used to display the selected profile. The vehicle system 200 also includes various sensors and modules that are used to provide or acquire information and provide that information to the tachometer profile module 255 for use in generating the predictive tachometer profile 265 and the blended tachometer profile 267. The sensors and modules can include a transmission input speed sensor 214, a tap switch sensor 216, a transmission range selector 219, a transmission output speed sensor 218, a wheel speed sensor 221, a chassis control module 224, a crank position sensor 242, a cam position sensor 244, a brake pedal position sensor 250, and an accelerator pedal position sensor 246. In addition, in some embodiments, the vehicle can include an electronic transmission range selector 222 that can provide transmission shifter position.

The basic functions of the TCM 230 and ECM 240 are described above with reference to FIG. 1, and for sake of brevity, that description of the TCM 230 and ECM 240 will not be repeated.

The transmission input speed sensor 214 can determine (measure or alternatively sense) input speed of the transmission 220, and output a signal representative of transmission input speed. The product of the input speed of the transmission 220 and transmission ratio is gear speed. In one embodiment, the transmission input speed can be communicated over a bus to the TCM 230, and the TCM 230 can provide the transmission input speed to the predictive tachometer module 260. The predictive tachometer module 260 can then use the transmission input speed as one of the input parameters used to generate the predictive tachometer profile 265. For example, when the transmission 220 is a dual clutch transmission (DCT) the transmission input speed can be used to calculate a shift completion percentage ($P_{ShiftComp}$).

The tap switch sensor 216 can output a signal representative of tap mode status and communicate it over a bus to the TCM 230. The TCM 230 can provide the tap mode status to the predictive tachometer module 260, and the predictive tachometer module 260 can use the tap mode status as one of the input parameters used in generating the predictive tachometer profile 265. The tap switch sensor 216 can provide information regarding tap mode status that shows whether driver is in control of transmission commanded gear. The tap mode status (on/off) can be used to inhibit computation of the predictive tachometer profile if transmission is downshifted when brake pedal is depressed hard and transmission is in tap mode (e.g., set to manual shift mode (+/−)). The current attained gear the transmission is operating at can be determined by the TCM 130. The TCM 130 can arbitrate what the current attained gear is using multiple solenoid states and pressure sensors. When the vehicle is in drive (not in tap shift mode), the TCM 130 arbitrates what the commanded gear should be based on vehicle speed, accelerator pedal position, and brake pedal position, etc.

The transmission output speed sensor 218 can determine (measure or alternatively sense) output speed of the transmission 220, and output a signal representative of transmission output speed. In one embodiment, the transmission output can be communicated over the bus to the TCM 230, and the TCM 230 can provide the transmission output speed to the predictive tachometer module 260. The predictive tachometer module 260 can then use the transmission output speed as one of the input parameters used to generate the predictive tachometer profile 265. For example, the product of gear ratio and the transmission output speed can be used to calculate a commanded gear speed.

The transmission range selector 219 can output a signal representative of transmission shifter position and communicate it over a bus to the TCM 230. The TCM 230 can provide the transmission shifter position to the predictive tachometer module 260, and the predictive tachometer module 260 can use the transmission shifter position as one of the input parameters used in generating the predictive tachometer profile 265. For example, the transmission shifter position can be used as part of profile abort case in case the driver accidentally shifts from drive to neutral during a transmission shift. The transmission shifter position can be used to blend the predictive tachometer profile back to engine speed prior to completion of the transmission shift.

In some embodiments, the vehicle includes an electronic transmission range selector 222 (shown in a dotted-line block since it is optional) as opposed to the transmission range selector 219. To explain further, some transmissions are equipped with traditional cable based transmission range selectors 219, whereas other transmissions are equipped with an electronic transmission range selector 222 that can be used to determine transmission shifter position. In such embodiments, the chassis control module 224 can output a signal representative of vehicle speed and the transmission shifter position and communicate them over a bus to the TCM 230 and/or the ECM 240. The TCM 230 can provide the vehicle speed and the transmission shifter position to the predictive tachometer module 260, and the predictive tachometer module 260 can use the vehicle speed and the transmission shifter position as input parameters used in generating the predictive tachometer profile 265. In addition, to provide backup protection in the event that the transmission output speed cannot provide the information used to provide the vehicle speed, the wheel speed sensor 221 can communicate vehicle speed to the CCM 224.

The TCM 230 can also determine can determine the commanded gear and the current gear, and provide this information to the predictive tachometer module 260. The predictive tachometer module 260 can then use the commanded gear and the current gear as some of the input parameters used to generate the predictive tachometer profile 265.

The crank position sensor 242 and the cam position sensor 244 both determine (measure or alternatively sense and output) position and/or speed of the engine 220, and output a signal representative of engine position and/or speed. In one embodiment, the crank position sensor 242 or the cam position sensor 244 can communicate the current engine speed can be communicated over the bus to the ECM 240, and the ECM 240 can provide the current engine speed to the predictive tachometer module 260. In another embodiment, the crank position sensor 242 or the cam position sensor 244 can send engine position over the bus to the ECM 240, and the ECM 240 can use the engine position to compute current engine speed and provide current engine speed to the predictive tachometer module 260. The predictive tachometer module 260 can then use the engine speed as one of the input parameters used to generate the predictive tachometer profile 265. For example, the engine speed can be used as a target point for the predictive tachometer profile when the transmission shift is complete so that when the shift is complete, the predictive tachometer profile will be equal to the actual engine speed from the sensor 242 or 244.

The accelerator pedal position sensor 246 can determine (measure or alternatively sense) position of the accelerator pedal, and output a signal representative of accelerator pedal position. In one embodiment, the accelerator pedal position can be communicated over a bus to the ECM 240, and the ECM 240 can provide the accelerator pedal position to the predictive tachometer module 260. The predictive tachometer module 260 can then use the accelerator pedal position as one of the input parameters used to generate the predictive tachometer profile 265. The ECM 240 can determine a driver requested/commanded engine torque based on accelerator pedal position and vehicle speed, and use the driver requested/commanded engine torque as one of the input parameters used to generate the predictive tachometer profile 265. As noted above, in one embodiment, the ECM 240 stores a two-dimensional lookup table (LUT) that uses the vehicle speed and the position of the accelerator pedal to generate the driver's commanded torque. This calibratable table is a function of accelerator pedal position and vehicle speed.

The brake pedal position sensor 250 can determine (measure or alternatively sense) position of the brake pedal, and output a signal representative of brake pedal position. In one embodiment, the brake pedal position can be communicated over a bus to the ECM 240, and the ECM 240 can provide the brake pedal position to the predictive tachometer module 260. The predictive tachometer module 260 can then use the brake pedal position as one of the input parameters used to generate the predictive tachometer profile 265. The brake pedal position can be used as part of criterion to inhibit calculation of the predictive tachometer profile, for example, when vehicle is coming to hard deceleration.

The tachometer profile module 255 can be implemented a control unit that exists within the vehicle (e.g., the ECM or TCM) or as an independent controller that is dedicated to generating information that is displayed at an instrumentation panel of the vehicle. The tachometer profile module 255 can include without limitation: a main memory, one or more processing system(s), a network interface device (NID) for interfacing with various systems including the ECM and TCM. The tachometer profile module 255 interconnects the various systems with the processing system(s) and the main memory, and also includes functionality for providing network connectivity through the NID. The processing system(s) communicates with main memory and the NID via chipset and appropriate buses (e.g., CAN busses). Processing system(s) can be implemented using one or more general-purpose processing devices such as a microprocessor, central processing unit, or the like. The processing system(s) may also be one or more special-purpose processing devices such as an application specific integrated circuit (ASIC), a field programmable gate array (FPGA), a digital signal processor (DSP), network processor, or the like. The processing system(s) can include one or more central processing units ("CPUs") that operate in conjunction with a chipset that provides an interface to various forms of computer-readable storage media including a main memory (e.g., read-only memory (ROM), flash memory, dynamic random access memory (DRAM) such as synchronous DRAM (SDRAM)), and storage devices (not illustrated). The processing system(s) can communicate with the various forms for computer-readable storage media via the chipset and appropriate buses. The processing system(s) perform arithmetic and logical operations necessary for the operation of the tachometer profile module 255. The processing system(s) can perform the necessary operations by transitioning from one discrete, physical state to the next through the manipulation of switching elements that differentiate between and change these states. Switching elements may generally include electronic circuits that maintain one of two binary states, such as flip-flops, and electronic circuits that provide an output state based on the logical combination of the states of one or more other switching elements, such as logic gates. These basic switching elements may be combined to create more complex logic circuits, including registers, adders-subtractors, arithmetic logic units, floating-point units, and the like.

The main memory of the tachometer profile module 255 may be composed of many different types of memory components. The main memory can include non-volatile memory (such as read-only memory (ROM), flash memory, etc.), and volatile memory (such as random access memory (RAM)), or some combination of the two. The volatile memory includes a computer-readable medium on which is stored one or more sets of instructions (e.g., executable code for one or more programs) that can be loaded and executed at processing system(s) to cause the processing system(s) to perform various functions of the tachometer profile module 255 that are described herein.

For example, as will be explained below, the processing system(s) of the predictive tachometer module 260 can access computer-readable storage media and execute computer-executable instructions stored therein to receive the input parameters (e.g., turbine speed, transmission input speed, tap mode status, transmission output speed, vehicle speed, transmission shifter position, commanded gear, current attained gear, engine speed, accelerator pedal position, brake pedal position) when the vehicle is moving, determine that an inertia phase of a shift event is in progress, and process the input parameters to generate the predictive tachometer profile 265 that is displayed as a tachometer profile on/at the tachometer 275. The inertia phase of the shift event refers to a phase of the shift event known as "ratio change" phase where the oncoming clutch pressure is raised and off-going clutch pressure is decreased to initiate turbine/input shaft speed pulldown or pull up to the transmission's desired commanded gear speed.

Various functions performed by the processing system(s) of the tachometer profile module 255 upon loading and executing the instructions are described below in greater detail with reference to FIG. 3.

Figure 3:
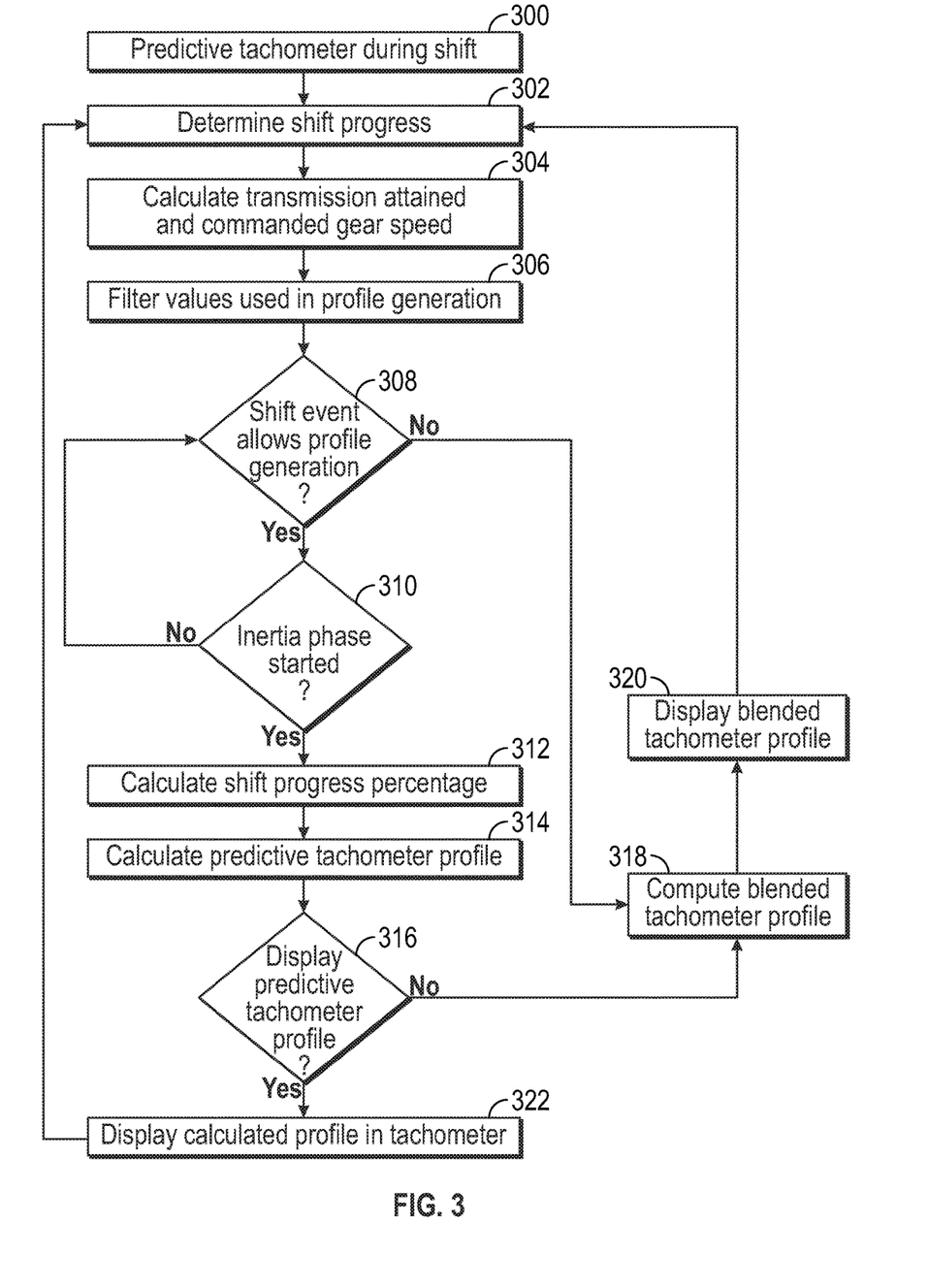
FIG. 3 is a flowchart that illustrates a method for generating a predictive tachometer profile that is displayed at a tachometer in accordance with the disclosed embodiments.

FIG. 3 is a flowchart that illustrates a method 300 for generating a tachometer profile 265, 267 that is displayed at a tachometer in accordance with the disclosed embodiments. The method 300 is used, for example, when the vehicle is moving and a shift event is in progress (e.g., during an inertia phase of the shift event), to compute the tachometer profile 265, 267, and then display it at the tachometer 275.

As a preliminary matter, it should be understood that steps of the method 300 are not necessarily limiting, and that steps can be added, omitted, and/or performed simultaneously without departing from the scope of the appended claims. It should be appreciated that the method 300 may include any number of additional or alternative tasks, that the tasks shown in FIG. 3 need not be performed in the illustrated order, and that the method 300 may be incorporated into a more comprehensive procedure or process having additional functionality not described in detail herein. Moreover, one or more of the tasks shown in FIG. 3 could be omitted from an embodiment of the method 300 as long as the intended overall functionality remains intact. It should also be understood that the illustrated method 300 can be stopped at any time. The method 300 is computer-implemented in that various tasks or steps that are performed in connection with the method 300 may be performed by software, hardware, firmware, or any combination thereof. For illustrative purposes, the following description of the method 300 may refer to elements mentioned above in connection with FIGS. 1 and 2. In certain embodiments, some or all steps of this process, and/or substantially equivalent steps, are performed by execution of processor-readable instructions stored or included on a processor-readable medium. For instance, in the description of FIG. 3 that follows, the predictive tachometer module 260 will be described as performing various acts, tasks or steps, but it should be appreciated that this refers to processing system(s) of the predictive tachometer module 260 executing instructions to perform those various acts, tasks or steps. Depending on the implementation, the processing system(s) of the predictive tachometer module 260 can be centrally located, or distributed among a number of systems that work together.

The tachometer profile module 255 can continuously receive various input parameters as described above with reference to FIG. 2, but it should be appreciated that the method 300 is operable when the vehicle is moving.

The method 300 begins at 302 when the tachometer profile module 255 determines whether a shift event is in progress. The tachometer profile module 255 can determine whether a shift event is in progress by comparing information regarding the current (attained) gear to the commanded gear. When the tachometer profile module 255 determines that the current (attained) gear is greater than the commanded gear, then the tachometer profile module 255 determines that a downshift is in progress. When the tachometer profile module 255 determines that the current (attained) gear is less than the commanded gear, then the tachometer profile module 255 determines that an upshift is in progress. When the tachometer profile module 255 determines that the current (attained) gear is equal to the commanded gear, then the tachometer profile module 255 determines that no shift even is in progress. The method 300 proceeds to 304 when the tachometer profile module 255 determines that an inertia phase of a shift event (e.g., downshift or upshift) is in progress.

At 304, the tachometer profile module 255 calculates values for the attained gear speed and the commanded gear speed.

In one embodiment, the tachometer profile module 255 calculates the attained gear speed based on the product of the transmission output speed in attained gear ratio.

In one embodiment, the tachometer profile module 255 calculates commanded gear speed based on the product of the transmission output speed and the commanded gear ratio. In one implementation, the tachometer profile module 255 can also compensate for turbine slip during the calculation of the commanded gear speed by offsetting the value of the commanded gear speed by a value which is the average turbine slip speed from the start of shifting until the start of an inertia phase.

At 306, the tachometer profile module 255 filters the values for the attained gear speed and the commanded gear speed that were computed at 304. In accordance with one embodiment, a first-order lag filter can be applied to each value the attained gear speed and the commanded gear speed. The first-order lag filter will have a first value from the start of the shift to the start of an inertia phase, and the second value will be from start of the inertia phase to the end of the shift. The tachometer profile module 255 then stores the filtered values for the attained gear speed and the commanded gear speed.

At 308, the tachometer profile module 255 determines whether the current shift event allows for generation of the predictive tachometer profile 265. In one embodiment, the tachometer profile module 255 determines whether the current shift event allows for generation of the tachometer profile based on one or more of the conditions based on the current attained gear, the commanded gear, the accelerator pedal position, the brake pedal position, and vehicle speed. When the tachometer profile module 255 determines (at 308) that the current shift event does not allow for generation of the predictive tachometer profile 265, the method proceeds to 318.

For example, one scenario where the tachometer profile module 255 determines (at 308) that the current shift event does not allow for generation of the predictive tachometer profile 265 would be when the inertia phase has elapsed for a calibratable duration (e.g., the shift remaining ratio is below calibratable threshold) and attained gear speed and engine speed difference is less than calibratable value (e.g., 100 rpm). In this scenario, calculation of a predictive tachometer profile (at 314) can effectively be inhibited. At 318, the blended tachometer module 266 can generate a blended tachometer profile 267 that will be selected by and output from the tachometer profile selection module 268, and then displayed (at 320) at the tachometer 275. The blended tachometer profile 267 will be blended such that the current engine speed will be displayed at the tachometer 275 for the remainder of the current shift event.

Another scenario where the tachometer profile module 255 determines (at 308) that the current shift event does not allow for generation of the predictive tachometer profile 265 would be when a shift event is started with engine speed below commanded gear speed upon upshift, or engine speed above commanded gear speed upon downshift. In this scenario, calculation of a predictive tachometer profile (at 314) can effectively be inhibited. At 318, the blended tachometer module 266 can generate a blended tachometer profile 267 that will be selected by and output from the tachometer profile selection module 268, and then displayed (at 320) at the tachometer 275. The blended tachometer profile 267 will be blended such that the current engine speed will be displayed at the tachometer 275 for the remainder of the current shift event.

Yet another scenario where the tachometer profile module 255 determines (at 308) that the current shift event does not allow for generation of the predictive tachometer profile 265 would be when the shift event is started, but shift power remains zero after the inertia phase has elapsed for a calibratable duration. In this scenario, calculation of a predictive tachometer profile (at 314) can effectively be inhibited. At 318, the blended tachometer module 266 can generate a blended tachometer profile 267 that will be selected by and output from the tachometer profile selection module 268, and then displayed (at 320) at the tachometer 275. The blended tachometer profile 267 will be blended such that the current engine speed will be displayed at the tachometer 275 for the remainder of the current shift event.

Yet another scenario where the tachometer profile module 255 determines (at 308) that the current shift event does not allow for generation of the predictive tachometer profile 265 would be when the shift event is coast downshift and the vehicle is not in tap mode. The transmission shift type can be considered to be a coast downshift if (1) the commanded engine torque is less than calibratable threshold, (2) the effective accelerator position is less than calibratable threshold, or (3) the brake pedal position is greater than calibratable threshold. In this scenario, calculation of a predictive tachometer profile (at 314) can effectively be inhibited. At 318, the blended tachometer module 266 can generate a blended tachometer profile 267 that will be selected by and output from the tachometer profile selection module 268, and then displayed (at 320) at the tachometer 275. The blended tachometer profile 267 will be blended such that the current engine speed will be displayed at the tachometer 275 for the remainder of the current shift event.

Still another scenario where the tachometer profile module 255 determines (at 308) that the current shift event does not allow for generation of the predictive tachometer profile 265 would be when the shift event is a tap downshift, and (1) brake pedal position is greater than calibratable threshold, and (2) and the vehicle speed is less than calibratable threshold. This criterion would apply when vehicle is coming to a stop even when vehicle is in tap mode. In this scenario, calculation of a predictive tachometer profile (at 314) can effectively be inhibited. At 318, the blended tachometer module 266 can generate a blended tachometer profile 267 that will be selected by and output from the tachometer profile selection module 268, and then displayed (at 320) at the tachometer 275. The blended tachometer profile 267 will be blended such that the current engine speed will be displayed at the tachometer 275 for the remainder of the current shift event.

Thus, in any of these shift event scenarios, a predictive tachometer profile 265 will not be displayed at the tachometer 275. Rather, the blended tachometer module 266 can generate the blended tachometer profile 267 (at 318) that will be selected by and output from the tachometer profile selection module 268 to the tachometer 275. The blended tachometer profile 267 will be blended such that the current engine speed will be displayed (at 320) at the tachometer 275 for the remainder of the current shift event, and the method 300 will loop back to 302.

When the tachometer profile module 255 determines (at 308) that the current shift event allows for generation of the tachometer profile, the method 300 proceeds to 310. At 310, the tachometer profile module 255 determines whether an inertia phase of the current shift event has started. When the tachometer profile module 255 determines (at 310) that an inertia phase of the current shift event has not yet started, the method loops back to step 308. When the tachometer profile module 255 determines (at 308) that the inertia phase of the current shift event has started, the method 300 proceeds to 312.

How the tachometer profile module 255 makes the determination at 310 depends on whether the shift event is an upshift or a downshift.

For example, when the shift event is an upshift, the tachometer profile module 255 determines if the engine speed is below the attained gear speed by a calibratable value for a certain duration. The calibratable value and certain duration can be fixed values for a particular vehicle. The calibratable value and certain duration can help ensure that the transmission is in the inertia phase and that the shift event is actually taking place. In one embodiment, the certain duration can be set, for example, to a count of a certain number of software loops that satisfy a certain condition (e.g., during an upshift, if the engine speed is below the current attained gear speed by a certain amount for a number of software loops). If the engine speed is below the attained gear speed by the calibratable value for the certain duration, then the tachometer profile module 255 determines that the inertia phase has started and the method 300 proceeds to 312. So, for instance, if the loop rate is 12 milliseconds and the number of counts is 5, then the duration will be 60 milliseconds. As such, if engine speed is below the current attained gear speed by a certain amount for 60 ms, then it is determined that an upshift inertia phase has begun. By contrast, if the engine speed is above the attained gear speed by the calibratable value for the certain duration, then the tachometer profile module 255 determines that the inertia phase has not yet started and the method 300 loops back to 308.

On the other hand, when the shift event is a downshift, the tachometer profile module 255 determines if the engine speed is above the attained gear speed by a calibratable value for a certain duration. If the engine speed is above the attained gear speed by the calibratable value for the certain duration, then the tachometer profile module 255 determines that the inertia phase has started and the method 300 proceeds to 312. If the engine speed is below the attained gear speed by the calibratable value for the certain duration, then the tachometer profile module 255 determines that the inertia phase has not yet started and the method 300 loops back to 308.

At 312, the tachometer profile module 255 calculates a shift completion percentage ($P_{ShiftComp}$) for the current shift event (also referred to as a shift progress percentage). In one embodiment, the tachometer profile module 255 calculates the shift completion percentage as a ratio of a numerator and a denominator, where the numerator is the difference between current transmission input speed and transmission input speed when inertia phase has begun (i.e. start of predictive tachometer profile calculation), and where denominator is the difference between commanded gear speed and transmission input speed when inertia phase has begun.

At 314, the predictive tachometer module 260 can generate (e.g., compute or calculate) the predictive tachometer profile 265 based on: the computed shift completion percentage ($P_{ShiftComp}$) (from 312), a difference between the filtered value of the current (attained) gear speed (from 306) and the filtered value of the commanded gear speed (from 306), and a commanded engine torque. In one embodiment, the predictive tachometer profile 265 can be computed using equation (1) as follows:

$$N_{Tach} = \left(P_{shiftRemain}^{k_{shiftpower}}\right) \cdot (N_{Input} - N_{Cmd}) + \\ N_{Cmd} + \left(P_{ShiftComp}^{k_{SlipPower}}\right) \cdot (N_{Engine} - N_{Target}) \quad \text{Equation (1)}$$

where $N_{Tach}$ is a predictive tachometer profile 265 sent to the tachometer 275, $P_{ShiftComp}$ is a shift completion percentage, $P_{ShiftRemain}$ is a shift remaining percentage hat is equal to 100 percent minus the shift completion percentage ($P_{ShiftComp}$), $k_{ShiftPower}$ is a shaping coefficient, $N_{Input}$ is an input speed reference point (e.g., the starting engine speed at the start of inertia phase) for the predictive tachometer profile 265, $N_{Cmd}$ is the filtered, commanded gear speed (from 306), $k_{SlipPower}$ is a blending coefficient, $N_{Engine}$ is engine speed, and $N_{Target}$ is a predicted tachometer profile target point.

The shift completion percentage ($P_{ShiftComp}$) will be zero percent at the start of the inertia phase, and 100 percent at end of the shift event.

The shaping coefficient ($k_{ShiftPower}$) has a value that determines the slope of the predicted tachometer profile 265. The shaping coefficient ($k_{ShiftPower}$) is determined based on (a) a difference between current attained gear speed and commanded gear speed, and (b) a commanded engine torque. The shaping coefficient ($k_{ShiftPower}$) can be determined from a two-dimensional lookup table that receives inputs including (1) the difference between the filtered value of the current (attained) gear speed (from 306) and the filtered value of the commanded gear speed (from 306), and (2) the commanded engine torque.

The commanded engine torque can be commanded by a computer (e.g., when the vehicle is operating autonomously), or can be commanded by the driver as the driver presses the accelerator pedal. The commanded engine torque can be computed by the ECM 240 based on the accelerator pedal position and the vehicle speed. For example, in one embodiment, the commanded engine torque can be computed by the ECM 240 by performing a lookup in another two-dimensional lookup table that uses the accelerator pedal position and the vehicle speed as its inputs.

The blending coefficient ($k_{SlipPower}$) has a fixed value that determines the slope of predictive tachometer profile when merging back to actual engine speed.

Prior to inertia phase and when the start of the inertia phase is just detected, the shift remaining ratio ($P_{ShiftRemain}$) will be equal to one (or 100%) and the shift completion ratio ($P_{ShiftComp}$) will be equal to zero, so the predicted tachometer profile value ($N_{Tach}$) will be equal to the input speed reference point ($N_{Input}$).

When the inertia phase of the transmission shift event is determined to be in progress, values of the shift remaining ratio ($P_{ShiftRemain}$) and the shift completion ratio ($P_{ShiftComp}$) will be between one (100 percent) and zero, and the value of the predictive tachometer profile will be computed as the sum of (1) a filtered commanded gear speed ($N_{Cmd}$), (2) a first product, and (3) a third product. The first product is equal to a product of (a) a difference between a predicted tachometer profile input speed reference point ($N_{Input}$) and the filtered commanded gear speed ($N_{Cmd}$), and (b) a shift progress scaling factor that is equal to a shift remaining ratio ($P_{ShiftRemain}$) raised to a power of a predicted tachometer profile shaping coefficient ($k_{ShiftPower}$). The a second product is equal to a product of (c) a difference between an engine speed ($N_{Engine}$) and a predicted tachometer profile target point ($N_{Target}$), and (d) a shift completion scaling factor that is equal to a shift completion ratio ($P_{ShiftComp}$) raised to a power of a predicted tachometer profile blending coefficient ($k_{SlipPower}$).

When the inertia phase is complete, the shift remaining ratio ($P_{shiftRemain}$) will be equal to zero and the shift completion ratio ($P_{ShiftComp}$) will be equal to one (or 100 percent), which means that predicted tachometer profile target point ($N_{Target}$) will be equal to the filtered commanded gear speed ($N_{Cmd}$), so the predicted tachometer profile value ($N_{Tach}$) will be equal to the engine speed ($N_{Engine}$).

At 316, the tachometer profile module 255 can determine whether the predictive tachometer profile 265 (that was generated at 314) should be displayed as the tachometer profile at the tachometer 275 of the instrumentation panel 270. In some scenarios, the predictive tachometer profile 265 (that was generated at 314) should not be displayed as the tachometer profile at the tachometer 275. In any of these scenarios, at 318, the blended tachometer module 266 can generate a blended tachometer profile 267 that will be selected by and output from the tachometer profile selection module 268, and then displayed at the tachometer 275 (at 320). The blended tachometer profile 267 will be blended such that the current engine speed will be displayed at the tachometer 275 for the remainder of the current shift event.

For example, one scenario where the predictive tachometer profile 265 (that was generated at 314) should not be displayed as the tachometer profile at the tachometer 275 would be when the shift event is started and attained gear changed to neutral (e.g., range selected from drive to neutral, or vehicle coming to very hard stop at non-zero vehicle speed). In this case, the shift event is considered to be aborted, and the tachometer profile should blend back to actual engine speed using a calibratable blending factor. This blending factor is unique for upshift neutral abort and downshift neutral abort. At 318, the blended tachometer module 266 can generate a blended tachometer profile 267 that will be selected by and output from the tachometer profile selection module 268, and then displayed at the tachometer 275 (at 320). The blended tachometer profile 267 will be blended such that the current engine speed will be displayed at the tachometer 275 for the remainder of the current shift event. Further, after the blending if completed, the current engine speed can be displayed and the predictive tachometer profile calculation (at 314) will be inhibited for the remainder of the current shift event.

Another scenario where the predictive tachometer profile 265 (that was generated at 314) should not be displayed as the tachometer profile at the tachometer 275 would be when the shift event is started and the commanded gear speed is below an engine idle speed. In this case, the profile can be blended back to actual engine speed and the predictive tachometer profile calculation (at 314) can be inhibited until the next shift event. At 318, the blended tachometer module 266 can generate a blended tachometer profile 267 that will be selected by and output from the tachometer profile selection module 268, and then displayed at the tachometer 275 (at 320). The blended tachometer profile 267 will be blended such that the current engine speed will be displayed at the tachometer 275 for the remainder of the current shift event. Further, after the blending if completed, the current engine speed can be displayed and the predictive tachometer profile calculation (at 314) will be inhibited for the remainder of the current shift event.

Still another scenario where the predictive tachometer profile 265 (that was generated at 314) should not be displayed as the tachometer profile at the tachometer 275 would be when the shift event is started and a shift completion ratio is above calibratable threshold, but the current attained gear is equal to commanded gear. In this scenario, the shift event is considered aborted, and the tachometer profile should blend back to actual engine speed using a calibratable blending factor. At 318, the blended tachometer module 266 can generate a blended tachometer profile 267 that will be selected by and output from the tachometer profile selection module 268, and then displayed at the tachometer 275 (at 320). The blended tachometer profile 267 will be blended such that the current engine speed will be displayed at the tachometer 275 for the remainder of the current shift event. Further, after the blending if completed, the current engine speed can be displayed and the predictive tachometer profile calculation (at 314) can be inhibited until the next shift event.

Yet another scenario where the predictive tachometer profile 265 (that was generated at 314) should not be displayed as the tachometer profile at the tachometer 275 would be when one of the sensor inputs (e.g., crank shaft position, transmission gear (attained and commanded), transmission range, vehicle speed, brake pedal position, or accelerator pedal position) has faulted. In this scenario, the shift event is considered aborted, and the tachometer profile should blend back to actual engine speed using a calibratable blending factor. The blending factor is unique for sensor failure cases. At 318, the blended tachometer module 266 can generate a blended tachometer profile 267 that will be selected by and output from the tachometer profile selection module 268, and then displayed at the tachometer 275 (at 320). The blended tachometer profile 267 will be blended such that the current engine speed will be displayed at the tachometer 275 for the remainder of the current shift event. Further, after the blending if completed, the current engine speed can be displayed and the predictive tachometer profile calculation (at 314) can be inhibited until the next shift event.

Referring again to FIG. 3, when the tachometer profile module 255 determines (at 316) that the predictive tachometer profile 265 (that was generated at 314) should not be displayed as the tachometer profile at the tachometer 275, then the method 300 proceeds to 318. In other words, the method 300 can proceed to 318 whenever any of the scenarios described above with reference to 316 occurs (e.g., shifter is place in neutral while a shift is in progress; shift event is started and the commanded gear speed is below an engine idle speed; shift event is started and a shift completion ratio is above calibratable threshold, but the current attained gear is equal to commanded gear; a sensor faults, etc.).

At 318, the blended tachometer module 266 can generate a blended tachometer profile, and the tachometer profile selection module 268 can then send the blended tachometer profile to the instrumentation panel 270 so that it can then be displayed at the tachometer 275 (at 320). In one embodiment, the blended tachometer module 266 can generate the blended tachometer profile (BTP) using equation (2) as follows:

$$BTP = BE + BAE \quad \text{Equation (2)},$$

where the BTP is the blended tachometer profile, BE is the blended engine speed, and BAE is the blended artificial engine speed.

The blended artificial engine speed (BAE) is equal to a product of a first blending progression coefficient (COEFF1) and the predictive tachometer profile 265 (that was generated at 314).

The blended engine speed (BE) is equal to a product of a second blending progression coefficient (COEFF2) and engine speed. The second blending progression coefficient (COEFF2) is equal to one (1) minus a current value of the first blending progression coefficient (COEFF1). In other words, the sum of the first blending progression coefficient (COEFF1) and the second blending progression coefficient (COEFF2) is always equal to one.

The current value of the first blending progression coefficient (COEFF1) is equal to a previous value of the first blending progression coefficient (COEFF1) minus a blend factor that is used to decrement the previous value of the first blending progression coefficient (COEFF1) by a fixed amount during each software loop.

The blend factor is a fixed calibratable value between zero (0) and one (1). The blend factor determines how quickly the blended tachometer profile will blend to actual engine speed. The blended tachometer profile will blend to actual engine speed in a time equal to the rate of the software loop divided by the blend factor. For example, if the blend factor is set to 0.01 and the rate of the software loop is 12.5 milliseconds, the blended tachometer profile will blend to actual engine speed in 12.5 milliseconds/0.01 or 1250 milliseconds.

The value of the blended tachometer profile (BTP) is updated each software loop until blending is determined to be complete. Blending is determined to be complete when either (1) a difference between the value of the blended tachometer profile (BTP) and engine speed is determined to be less than a calibratable threshold value, or (2) the value of the first blending progression coefficient (COEFF1) is determined to be less than or equal to zero, which means that the blending function timed out.

When the tachometer profile module 255 determines (at 316) that the predictive tachometer profile 265 (that was generated at 314) should be displayed as the tachometer profile at the tachometer 275, then the method 300 proceeds to 322, where the tachometer profile selection module 268 can send the predictive tachometer profile 265 to the tachometer 275 of the instrumentation panel 270, where the predictive tachometer profile 265 can be displayed as a tachometer profile at the tachometer 275.

Figure 4:
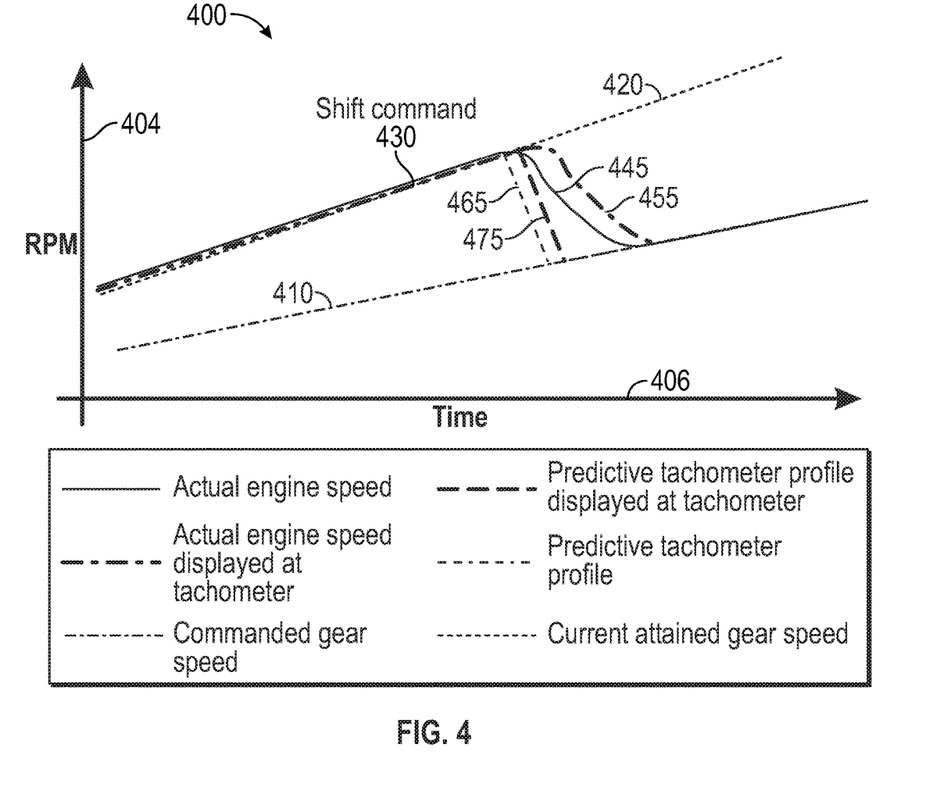
FIG. 4 is a set of graphs that show two sets of engine speed signals along with plots that show target gear speed and current gear speed.

FIG. 4 is a set of graphs 400 that show two sets of engine speed signals 445,455 and 465, 475, along with plots that show commanded gear speed 410 and current attained gear speed 420. FIG. 4 will be described with reference to FIG. 2. Each of the plots in FIG. 4 shows engine speed (in RPM) as a function of time. The plot labeled 445 shows an actual engine speed in a conventional system, whereas the plot labeled 455 shows how the actual engine speed signal 445 would appear when displayed at a conventional tachometer due to signal delays (e.g., CAN bus communication delays between ECM and instrument panel).

By contrast, the plot labeled 465 shows a predictive tachometer profile 265 that is computed in accordance with the disclosed embodiments, whereas the plot labeled 475 shows how the predictive tachometer profile 265 would be displayed at the tachometer 275 in accordance with the disclosed embodiments.

As can be seen by comparing the predictive tachometer profile 475 displayed at the tachometer 275 to the actual engine speed 455, the predictive tachometer profile 475 exhibits less delay. By providing the predictive tachometer profile 475 from the predictive tachometer module 260 to the tachometer 275 during transmission shift events, the dynamic response at the tachometer 275 can account for communication delays between the source of engine speed (crankshaft or camshaft position sensor) and the instrumentation panel 270 where the tachometer 275 is located. The predictive tachometer profile 475 targets the commanded gear input speed during the transmission shift event. The profile shape of the predictive tachometer profile 475 is controllable based on the difference between current attained gear input speed and commanded gear input speed, and the driver's commanded engine torque. This can improve the user/driver experience since the engine speed displayed at the tachometer 275 more closely matches the commanded engine torque, which improves the user/driver's perception of powertrain performance.

The foregoing description has been presented for purposes of illustration and description, but is not intended to be exhaustive or limit the scope of the claims. The embodiments described above are described to best explain one practical application, and to enable others of ordinary skill in the art to understand the invention for various embodiments with various modifications as are suited to the particular use contemplated.

In some instances, well-known components, systems, or methods have not been described in detail in order to avoid obscuring the present disclosure. Therefore, specific operational and functional details disclosed herein are not to be interpreted as limiting, but merely as a representative basis for teaching one skilled in the art.

Those of skill in the art would further appreciate that the various illustrative logical blocks and algorithm steps described in connection with the embodiments disclosed herein may be implemented as electronic hardware, computer software, or combinations of both. Some of the embodiments and implementations are described above in terms of functional and/or logical block components (or modules) and various processing steps. However, it should be appreciated that such block components (or modules) may be realized by any number of hardware, software, and/or firmware components configured to perform the specified functions. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC.

The block diagrams in the FIGS. 1-3 illustrate the architecture, functionality, and operation of possible implementations of systems, methods and computer program products according to various embodiments of the present invention. In this regard, each block in the block diagrams may represent a module, segment, or portion of code, which comprises one or more executable instructions for implementing the specified logical function(s). It should also be noted that, in some alternative implementations, the functions noted in the block may occur out of the order noted in the figures. It will also be noted that each block of the block diagrams and/or flowchart illustration, and combinations of blocks in the block diagrams can be implemented by special purpose hardware-based systems that perform the specified functions or acts, or combinations of special purpose hardware and computer instructions.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

The detailed description provides those skilled in the art with a convenient road map for implementing the exemplary embodiment or exemplary embodiments. Many modifications and variations will be apparent to those of ordinary skill in the art without departing from the scope and spirit of the invention. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodi-

What is claimed is:

1. A method for generating a predictive tachometer profile to be displayed at a tachometer of a vehicle, the method comprising
determining, at a predictive tachometer module, whether a transmission shift event is in progress by comparing a current attained gear to a commanded gear;
calculating, at the predictive tachometer module when the predictive tachometer module determines that the transmission shift event is in progress, a current attained gear speed based on a product of a transmission output speed and an attained gear ratio;
calculating, at the predictive tachometer module when the predictive tachometer module determines that the transmission shift event is in progress, a commanded gear speed based on a product of the transmission output speed and a commanded gear ratio, wherein calculating the commanded gear speed comprises: offsetting a calculated value of the commanded gear speed by a value which is an average turbine slip speed from a start of shifting until a start of an inertia phase to compensate for turbine slip during the calculating of the commanded gear speed;
receiving, when the vehicle is moving, input parameters comprising: the commanded gear speed, a commanded engine torque, the current attained gear speed during the transmission shift event, an accelerator pedal position, and a vehicle speed, wherein the commanded engine torque is determined based on the accelerator pedal position and the vehicle speed;
computing, when the inertia phase of the transmission shift event is determined to be in progress, the predictive tachometer profile based on: a computed shift completion percentage; a difference between the current attained gear speed and the commanded gear speed; and the commanded engine torque, wherein the predictive tachometer profile is an artificial engine speed signal that is computationally adjusted version of engine speed shifted to account for delays between generating an actual engine speed signal at an engine speed sensor and communicating the actual engine speed signal to the tachometer where engine speed is displayed to a driver; and
displaying, at the tachometer, the predictive tachometer profile.

2. A method according to claim 1, wherein the predictive tachometer profile displayed at the tachometer accounts for delays in a signal path between the engine speed sensor and the tachometer.

3. A method according to claim 1, wherein determining, at the predictive tachometer module, whether the transmission shift event is in progress by comparing the current attained gear to the commanded gear, comprises:
determining, at the predictive tachometer module, that a downshift is in progress when the current attained gear is greater than the commanded gear;
determining, at the predictive tachometer module, that an upshift is in progress when the current attained gear is less than the commanded gear; and
determining, at the predictive tachometer module, that no shift event is in progress when the current attained gear is equal to the commanded gear.

4. A method according to claim 1, further comprising:
filtering, at the predictive tachometer module, the current attained gear speed and the commanded gear speed.

5. A method according to claim 4, wherein filtering comprises:
applying, a first-order lag filter to the current attained gear speed and the commanded gear speed, wherein the first-order lag filter has a first value from a start of the transmission shift event to a start of the inertia phase, and a second value from the start of the inertia phase to an end of the transmission shift event.

6. A method according to claim 1, further comprising:
determining, at the predictive tachometer module based on the current attained gear, the commanded gear, the accelerator pedal position, a brake pedal position, and the vehicle speed, whether a current shift event allows for generation of the predictive tachometer profile.

7. A method according to claim 6, further comprising:
determining, at the predictive tachometer module when the predictive tachometer module determines that the current shift event allows for generation of the predictive tachometer profile, whether the inertia phase of the current shift event has started.

8. A method according to claim 7, wherein determining whether the inertia phase of the current shift event has started, comprises:
determining, at the predictive tachometer module when the current shift event is an upshift, whether the engine speed is below the attained gear speed by a calibratable value for a certain duration; and
further comprising:
determining, at the predictive tachometer module, that the inertia phase has started when the engine speed is determined to be below the current attained gear speed by the calibratable value for the certain duration.

9. A method according to claim 8, further comprising:
determining, at the predictive tachometer module, that the inertia phase has not started when the engine speed is determined to be above the attained gear speed by the calibratable value for the certain duration.

10. A method according to claim 7, wherein determining whether the inertia phase of the current shift event has started, comprises:
determining, at the predictive tachometer module when the current shift event is a downshift, whether the engine speed is above the attained gear speed by a calibratable value for a certain duration; and
further comprising:
determining, at the predictive tachometer module, that the inertia phase has started when the engine speed is determined to be above the current attained gear speed by the calibratable value for the certain duration; and
determining, at the predictive tachometer module, that the inertia phase has not started when the engine speed is determined to be below the attained gear speed by the calibratable value for the certain duration.

11. A method according to claim 7, further comprising:
computing the shift completion percentage for the current shift event when the predictive tachometer module determines that the inertia phase of the transmission shift event has started, wherein the shift completion percentage is a ratio of a first difference to a second difference,
wherein the first difference is a difference between a current transmission input speed and a transmission input speed when the inertia phase began, and
wherein the second difference is a difference between the commanded gear speed and the transmission input speed when inertia phase began.

12. A method according to claim 1, wherein computing the predictive tachometer profile, comprises:
  computing, when the inertia phase of the transmission shift event is determined to be in progress, the predictive tachometer profile based on the sum of:
   a first product, a filtered commanded gear speed ($N_{Cmd}$), and a second product,
   wherein the first product is equal to a product of (1) a difference between an input speed reference point ($N_{Input}$) and the filtered commanded gear speed ($N_{Cmd}$), and (2) a shift progress scaling factor that is equal to a shift remaining ratio ($P_{ShiftRemain}$) raised to a power of a shaping coefficient ($k_{ShiftPower}$), and
   wherein the second product is equal to a product of (1) a difference between an engine speed ($N_{Engine}$) and a target point ($N_{Target}$), and (2) a shift completion scaling factor that is equal to a shift completion ratio ($P_{Shiftcomp}$) raised to a power of a blending coefficient ($k_{SlipPower}$).

13. A system, comprising:
  a tachometer; and
  a processor configured to:
   determine, at a predictive tachometer module, whether a transmission shift event is in progress by comparing a current attained gear to a commanded gear;
   calculate, at the predictive tachometer module when the predictive tachometer module determines that the transmission shift event is in progress, the current attained gear speed based on a product of a transmission output speed and an attained gear ratio;
   calculate, at the predictive tachometer module when the predictive tachometer module determines that the transmission shift event is in progress, a commanded gear speed based on a product of the transmission output speed and a commanded gear ratio, wherein the commanded gear speed is calculated by offsetting a calculated value of the commanded gear speed by a value which is an average turbine slip speed from a start of shifting until a start of an inertia phase to compensate for turbine slip during the calculating of the commanded gear speed;
   generate, when the inertia phase of the transmission shift event is determined to be in progress, a predictive tachometer profile based on: a computed shift completion percentage; a difference between the current attained gear speed during the transmission shift event and the commanded gear speed; and a commanded engine torque that is determined based on an accelerator pedal position and a vehicle speed, wherein the predictive tachometer profile is an artificial engine speed signal that is computationally adjusted version of engine speed shifted to account for delays between generating an actual engine speed signal at an engine speed sensor and communicating the actual engine speed signal to the tachometer where engine speed is displayed to a driver; and
   provide the predictive tachometer profile to the tachometer, wherein the tachometer is configured to display the predictive tachometer profile.

14. A system according to claim 13, wherein the processor is further configured to:
  compute, when the inertia phase of the transmission shift event is determined to be in progress, the commanded engine torque requested by the driver based on the accelerator pedal position and the vehicle speed.

15. A vehicle, comprising:
  a tachometer; and
  a processor configured to:
   determine, at a predictive tachometer module, whether a transmission shift event is in progress by comparing a current attained gear to a commanded gear;
   calculate, at the predictive tachometer module when the predictive tachometer module determines that the transmission shift event is in progress, the current attained gear speed based on a product of a transmission output speed and an attained gear ratio;
   calculate, at the predictive tachometer module when the predictive tachometer module determines that the transmission shift event is in progress, a commanded gear speed based on a product of the transmission output speed and a commanded gear ratio, wherein the commanded gear speed is calculated by offsetting a calculated value of the commanded gear speed by a value which is an average turbine slip speed from a start of shifting until a start of an inertia phase to compensate for turbine slip during the calculating of the commanded gear speed;
   generate, when the inertia phase of the transmission shift event is determined to be in progress, a predictive tachometer profile based on: a computed shift completion percentage; a difference between the current attained gear speed during the transmission shift event and the commanded gear speed; and a commanded engine torque that is determined based on an accelerator pedal position and a vehicle speed, wherein the predictive tachometer profile is an artificial engine speed signal that is computationally adjusted version of engine speed shifted to account for delays between generating an actual engine speed signal at an engine speed sensor and communicating the actual engine speed signal to the tachometer where engine speed is displayed to a driver; and
   provide the predictive tachometer profile to the tachometer, wherein the tachometer is configured to display the predictive tachometer profile.

* * * * *